(12) United States Patent
Bolken et al.

(10) Patent No.: US 7,399,657 B2
(45) Date of Patent: Jul. 15, 2008

(54) BALL GRID ARRAY PACKAGES WITH THERMALLY CONDUCTIVE CONTAINERS

(75) Inventors: Todd O. Bolken, Meridian, ID (US); Chad A. Cobbley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 398 days.

(21) Appl. No.: 10/209,753

(22) Filed: Jul. 31, 2002

(65) Prior Publication Data

US 2002/0187590 A1    Dec. 12, 2002

Related U.S. Application Data

(62) Division of application No. 09/653,127, filed on Aug. 31, 2000, now Pat. No. 6,559,537.

(51) Int. Cl.
| | |
|---|---|
| H01L 23/10 | (2006.01) |
| H01L 23/29 | (2006.01) |
| H01L 23/28 | (2006.01) |
| H01L 21/66 | (2006.01) |
| H01L 21/00 | (2006.01) |
| H01L 23/12 | (2006.01) |
| B65D 85/00 | (2006.01) |

(52) U.S. Cl. .................. 438/106; 438/12; 438/23; 438/26; 438/27; 438/28; 438/30; 438/31; 438/34; 438/36; 438/37; 438/38; 438/39; 438/40; 257/704; 257/706; 257/707; 257/790; 257/791; 257/792; 257/793; 257/794; 257/795; 257/796; 206/710; 206/711; 206/712; 206/713; 206/714; 206/715; 206/716; 206/717; 206/832

(58) Field of Classification Search .............. 438/122, 438/155, 123, 124; 206/713–715, 717, 722, 206/724, 710; 257/704

See application file for complete search history.

(56) References Cited

U.S. PATENT DOCUMENTS 2,570,221 A    4/1951    Wieczorek (Continued)

FOREIGN PATENT DOCUMENTS

JP    358122753    *    7/1983

(Continued)

*Primary Examiner*—Carl Whitehead, Jr.
*Assistant Examiner*—James M Mitchell
(74) *Attorney, Agent, or Firm*—Perkins Coie LLP

(57) ABSTRACT

Ball grid array packages for semiconductor die include a thermally conductive container and a substrate that substantially enclose a semiconductor die. The die is positioned with respect to the container by thermally conductive supports formed in the container or attached to the container. The die contacts the supports so that the die and the container form a cavity that is at least partially filled with a thermally conductive material such as a conductive epoxy to promote thermal conduction between the die and the container. The die electrically connects to the substrate with bond wires that extend through an aperture in the substrate and attach to bond pads provided on the substrate. The aperture is typically filled with a protective layer of resin, epoxy, or other material that also encapsulates the bond wires. Solder balls are provided for electrical connection or the substrate and the die to a circuit board or other circuit element, and an encapsulant layer covers the surface of the substrate but permits electrical connection to the bond pads. Methods for packaging semiconductor die in such packages are also provided.

15 Claims, 5 Drawing Sheets

U.S. PATENT DOCUMENTS

| | | | | |
|---|---|---|---|---|
| 4,012,768 A | * | 3/1977 | Kirk et al. | 257/712 |
| 4,312,116 A | * | 1/1982 | Moser et al. | 29/829 |
| 4,514,752 A | * | 4/1985 | Engel et al. | 174/539 |
| 4,563,725 A | * | 1/1986 | Kirby | 361/708 |
| 4,641,176 A | | 2/1987 | Keryhuel | |
| 5,076,427 A | * | 12/1991 | Thomson et al. | 206/714 |
| 5,139,972 A | | 8/1992 | Neugebauer et al. | 438/113 |
| 5,157,478 A | * | 10/1992 | Ueda et al. | 257/796 |
| 5,163,551 A | * | 11/1992 | Bhatia | 206/725 |
| 5,199,564 A | * | 4/1993 | Skrtic | 206/714 |
| 5,216,278 A | | 6/1993 | Lin et al. | |
| 5,220,486 A | * | 6/1993 | Takubo et al. | 361/707 |
| 5,223,739 A | * | 6/1993 | Katsumata et al. | 257/676 |
| 5,246,129 A | * | 9/1993 | Small et al. | 220/23.4 |
| 5,279,029 A | * | 1/1994 | Burns | 29/856 |
| 5,293,072 A | | 3/1994 | Tsuji | |
| 5,311,060 A | * | 5/1994 | Rostoker et al. | 257/796 |
| 5,343,076 A | * | 8/1994 | Katayama et al. | 257/717 |
| 5,362,679 A | * | 11/1994 | Wakefield | 29/827 |
| 5,365,107 A | * | 11/1994 | Kuraishi et al. | 257/673 |
| 5,416,357 A | * | 5/1995 | Kobayashi et al. | 257/536 |
| 5,422,231 A | * | 6/1995 | Nozawa | 430/508 |
| 5,440,169 A | | 8/1995 | Tomita et al. | |
| 5,448,114 A | | 9/1995 | Kondoh | |
| 5,524,765 A | * | 6/1996 | Gutentag | 206/713 |
| 5,557,150 A | | 9/1996 | Variot et al. | |
| 5,583,377 A | * | 12/1996 | Higgins, III | 257/707 |
| 5,583,378 A | | 12/1996 | Marrs | |
| 5,594,204 A | * | 1/1997 | Taylor et al. | 174/527 |
| 5,604,376 A | | 2/1997 | Hamburgen | |
| 5,625,222 A | | 4/1997 | Yoneda | |
| 5,650,593 A | | 7/1997 | McMillan | |
| 5,653,020 A | | 8/1997 | Romano' et al. | |
| 5,667,073 A | * | 9/1997 | Okui | 206/713 |
| 5,677,566 A | | 10/1997 | King et al. | |
| 5,703,398 A | * | 12/1997 | Sono et al. | 257/706 |
| 5,708,304 A | | 1/1998 | Tomita | |
| 5,729,963 A | * | 3/1998 | Bird | 53/471 |
| 5,766,972 A | | 6/1998 | Takahashi et al. | |
| 5,770,479 A | * | 6/1998 | Brooks et al. | 438/123 |
| 5,775,510 A | * | 7/1998 | Hodges | 206/724 |
| 5,796,162 A | * | 8/1998 | Huang | 257/676 |
| 5,811,879 A | * | 9/1998 | Akram | 257/723 |
| 5,819,398 A | * | 10/1998 | Wakefield | 29/830 |
| 5,880,933 A | * | 3/1999 | Markow et al. | 361/704 |
| 5,893,724 A | | 4/1999 | Chakravorty et al. | |
| 5,909,056 A | * | 6/1999 | Mertol | 257/704 |
| 5,914,531 A | * | 6/1999 | Tsunoda et al. | 257/668 |
| 5,930,603 A | | 7/1999 | Tsuji | |
| 5,960,961 A | * | 10/1999 | Gutentag | 206/714 |
| 5,976,912 A | | 11/1999 | Fukutomi et al. | |
| 5,990,544 A | * | 11/1999 | Ohshima | 257/676 |
| 5,998,241 A | * | 12/1999 | Niwa | 438/122 |
| 5,998,862 A | * | 12/1999 | Yamanaka | 257/704 |
| 6,002,178 A | | 12/1999 | Lin | |
| 6,023,098 A | | 2/2000 | Higashiguchi et al. | |
| 6,038,136 A | | 3/2000 | Weber | |
| 6,048,754 A | * | 4/2000 | Katayama et al. | 438/115 |
| 6,049,038 A | | 4/2000 | Suzuki | |
| 6,075,288 A | * | 6/2000 | Akram | 257/706 |
| 6,075,289 A | * | 6/2000 | Distefano | 257/732 |
| 6,080,932 A | | 6/2000 | Smith et al. | |
| 6,097,609 A | * | 8/2000 | Kabadi | 361/760 |
| 6,114,189 A | | 9/2000 | Chia et al. | |
| 6,114,192 A | | 9/2000 | Tsunoda et al. | |
| 6,122,171 A | * | 9/2000 | Akram et al. | 361/704 |
| 6,149,010 A | * | 11/2000 | Tanaka et al. | 206/714 |
| 6,166,434 A | * | 12/2000 | Desai et al. | 257/704 |
| 6,166,435 A | * | 12/2000 | Leu et al. | 257/704 |
| 6,175,497 B1 | * | 1/2001 | Tseng et al. | 361/704 |
| 6,179,127 B1 | * | 1/2001 | Kato et al. | 206/714 |
| 6,187,612 B1 | | 2/2001 | Orcutt | |
| 6,225,144 B1 | | 5/2001 | How | |
| 6,249,403 B1 | * | 6/2001 | Tokisue et al. | 360/235.2 |
| 6,258,630 B1 | * | 7/2001 | Kawahara | 438/122 |
| 6,261,870 B1 | | 7/2001 | Haehn | |
| 6,271,058 B1 | * | 8/2001 | Yoshida | 438/108 |
| 6,300,165 B2 | * | 10/2001 | Castro | 438/118 |
| 6,329,220 B1 | | 12/2001 | Bolken et al. | |
| 6,331,453 B1 | | 12/2001 | Bolken et al. | |
| 6,333,564 B1 | | 12/2001 | Katoh et al. | |
| 6,351,030 B2 | | 2/2002 | Havens et al. | |
| 6,357,594 B1 | * | 3/2002 | Gutentag | 206/714 |
| 6,362,530 B1 | * | 3/2002 | Lee et al. | 257/778 |
| 6,376,907 B1 | * | 4/2002 | Takano et al. | 257/704 |
| 6,395,124 B1 | * | 5/2002 | Oxman et al. | 156/275.5 |
| 6,404,070 B1 | * | 6/2002 | Higashi et al. | 257/796 |
| 6,425,484 B1 | * | 7/2002 | Sakurai | 206/714 |
| 6,429,530 B1 | | 8/2002 | Chen | |
| 6,432,742 B1 | * | 8/2002 | Guan et al. | 438/106 |
| 6,432,749 B1 | * | 8/2002 | Libres | 438/122 |
| 6,440,599 B1 | * | 8/2002 | Takada et al. | 429/56 |
| 6,486,554 B2 | | 11/2002 | Johnson | |
| 6,541,310 B1 | * | 4/2003 | Lo et al. | 438/122 |
| 6,568,535 B1 | * | 5/2003 | Pylant | 206/713 |
| 6,576,988 B2 | * | 6/2003 | Corisis | 257/676 |
| 6,579,399 B1 | * | 6/2003 | Hamren | 156/232 |
| 6,586,845 B1 | * | 7/2003 | Higashi et al. | 257/784 |
| 6,626,656 B2 | | 9/2003 | Thummel | |
| 6,644,982 B1 | * | 11/2003 | Ondricek et al. | 439/73 |
| 6,650,005 B2 | | 11/2003 | Hung et al. | |
| 6,653,730 B2 | * | 11/2003 | Chrysler et al. | 257/704 |
| 6,660,558 B1 | | 12/2003 | Bolken et al. | |
| 6,825,550 B2 | * | 11/2004 | Akram | 257/678 |
| 2001/0040288 A1 | * | 11/2001 | Matsushima et al. | 257/704 |
| 2002/0060369 A1 | * | 5/2002 | Akram | 257/782 |

FOREIGN PATENT DOCUMENTS

| | | | |
|---|---|---|---|
| JP | 359188948 | * | 10/1984 |
| JP | 01298753 | * | 12/1989 |
| JP | 403116949 | * | 5/1991 |
| JP | 403147355 | * | 6/1991 |

* cited by examiner

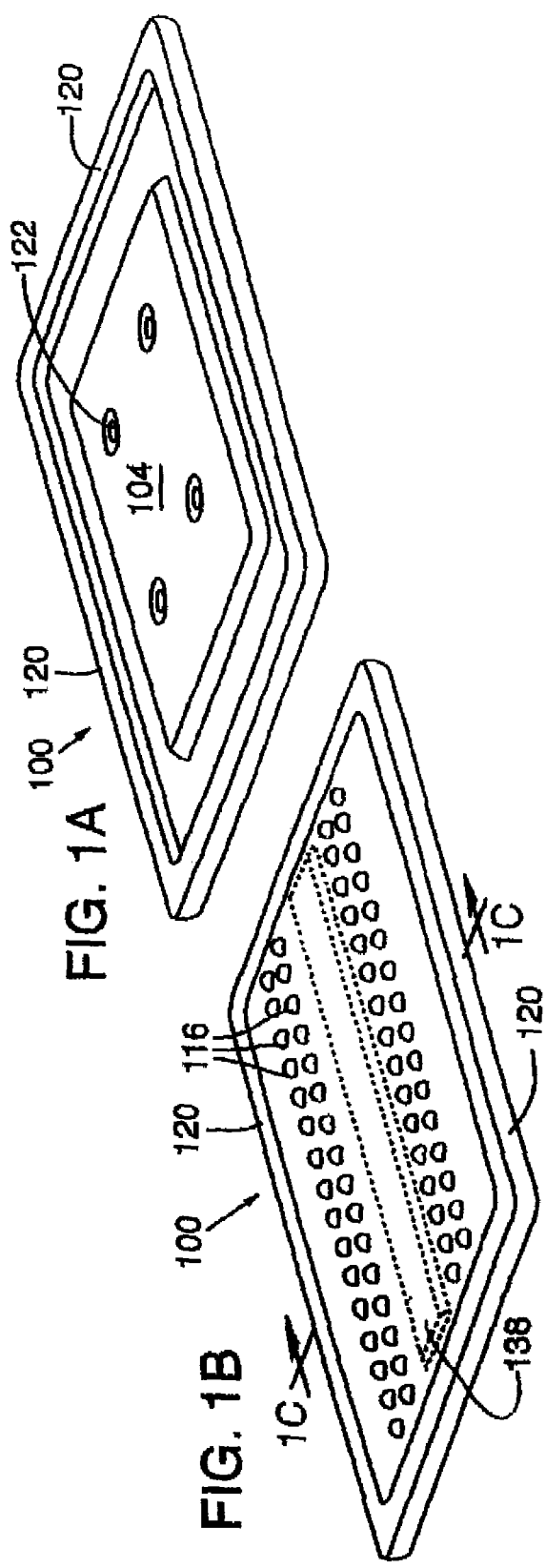
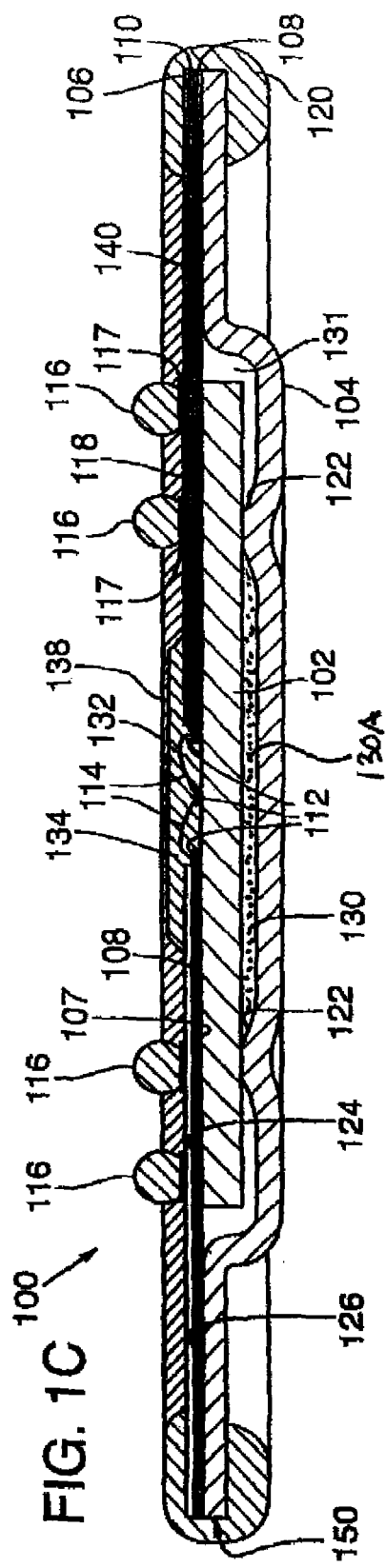
FIG. 1A
FIG. 1B
FIG. 1C

BALL GRID ARRAY PACKAGES WITH THERMALLY CONDUCTIVE CONTAINERS

CROSS-REFERENCE TO RELATED APPLICATIONS

This application is a division of application Ser. No. 09/653,127, filed Aug. 31, 2000 now U.S. Pat. No. 6,559,537, that is incorporated herein by reference.

TECHNICAL FIELD

The invention pertains to methods and apparatus for packaging electronic components such as semiconductor die.

BACKGROUND

The miniaturization of electronic devices such as integrated circuits continues to drive the costs of electronic products down even as the performance of these products increases. The development of improved lithographic methods and other fabrication processes as well as improved packaging and circuit interconnection methods have been important factors this trend.

While improvements in fabrication processes for miniaturization permit inexpensive manufacture of ever smaller devices, the interconnection of smaller devices can be difficult and expensive. In addition, the operation of smaller devices presents additional difficulties. Such smaller devices frequently are required to perform at least the same functions as the larger devices that they replace, and in many cases are expected to perform these functions faster and at a lower cost. A small device that operates at high speeds tends to generate large amounts of heat in a smaller volume, and dissipation of this heat is essential to avoid damage to the device so that the device has an acceptable time to failure. Therefore, improved circuit packages and packaging methods are needed that permit improved heat transfer.

Another significant problem in the use of integrated circuits is packaging the integrated circuit in such a way as to electrically connect to many, densely spaced input/output electrical connections. If the input/output electrical connections must be spread out to permit electrical connections to other integrated circuits, other circuits or circuit components such as printed circuit boards, then much of the advantage of integrated circuit miniaturization is lost.

One method of packaging integrated circuits for electrical connection to a printed circuit board is the so-called ball grid array (BGA) package. A BGA package includes a semiconductor die (an integrated circuit) that is attached to a substrate. Electrical connections are made from the die to the substrate with bond wires that are attached to bond pads provided on the die and the substrate. The bond pads on the substrate are electrically connected to an array of solder balls or bumps, and these solder balls are used to bond and make electrical connection to the printed circuit board. BGA packages are described in, for example, Tsuji et al., U.S. Pat. No. 5,930,603, Tsunoda et al., U.S. Pat. No. 5,914,531, and Tsuji et al., U.S. Pat. No. 5,293,072.

Not only are BGA packages more compact than other packages, BGA packaged devices generally have superior thermal and electrical properties. The solder balls provide an excellent thermal path for the removal of heat from the semiconductor die as well as providing low resistance, low inductance electrical connections. Nevertheless, improved BGA packages that provide even denser interconnections and greater heat removal are needed.

SUMMARY OF THE INVENTION

Containers for packaging semiconductor die are provided that include a thermally conductive strip having recesses configured to retain a semiconductor die. The containers may include at least one die standoff that extends into the recess. The die standoff is configured to provide a thermally conductive path between the semiconductor die and the container and fix the standoff distance. In representative embodiments, the thermally conductive material is a metal such as copper. In additional embodiments, the containers include a mounting surface for attaching the container to a substrate and the die standoff is configured so that a substrate attachment surface of the semiconductor die is substantially coplanar with the mounting surface with the die situated on the die standoff.

Packaged semiconductor die are provided that include a thermally conductive container bonded to the semiconductor die and a substrate bonded to the container. The packaged semiconductor die also include at least one interconnect that electrically connects the semiconductor die to the substrate. In further embodiments, a first surface of the substrate is bonded to the container and at least one solder bump projects from a surface of the substrate opposite the first surface. In still further embodiments, the packaged semiconductor die include a perimeter seal that encapsulates at least a portion of a perimeter of the substrate and a bond cap that encapsulates the interconnect. In other embodiments, the packaged die include an encapsulant that fills a cavity defined by the semiconductor die and the container.

Integrated circuit assemblies are provided that include a substrate and a semiconductor die electrically connected to the substrate. Solder bumps electrically connect the circuit board to the substrate, and the semiconductor die is attached to a thermally conductive container.

Packages for semiconductor die are provided that include a thermally conductive container defining a recess configured to receive a semiconductor die. The packages include a heat sink attached to the container, and, in representative embodiments, the heat sink and the container are of a unitary one-piece integral construction.

Methods of removing heat from a circuit assembly are provided that include providing a container of a thermally conducive material and attaching the semiconductor die to the container with a thermally conductive layer. A cavity defined by the semiconductor die and the container is filled with a thermally conductive encapsulant. In further embodiments, the semiconductor die and the container includes respective substrate mounting surfaces that are selected to be substantially coplanar.

Methods of packaging a semiconductor die include providing a thermally conductive container that includes at least one die support and situating the die at least partially within the container. The die is secured to the container with a heat conductive layer such as a thermally conductive epoxy and the die support is thermally conductive.

Methods of packaging include mounting a plurality of semiconductor die in corresponding cavities formed in a cavity strip; and attaching a substrate strip to the cavity strip. The plurality of die are separated by cutting the cavity strip and the substrate strip after attachment.

These and other features and advantages of the invention are set forth below with reference to the accompanying drawings.

BRIEF DESCRIPTION OF THE DRAWINGS

FIGS. 1A-1B are perspective views of an exemplary ball grid array package for a semiconductor die.

FIG. 1C is a sectional view of the ball grid array package of FIGS. 1A-1B.

DETAILED DESCRIPTION

Figure 2A:
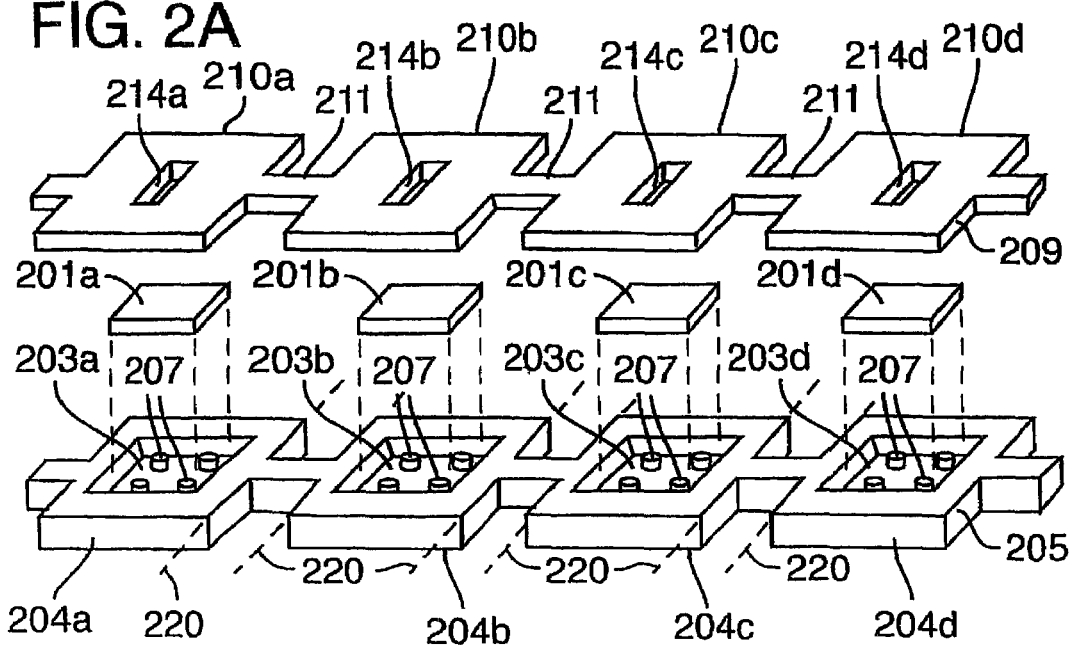
FIGS. 2A-2B are a perspective view and a sectional view, respectively, illustrating an embodiment of BGA assemblies produced with a container strip and a substrate strip.

With reference to FIGS. 1A-1C, a ball grid array ("BGA") assembly 100 in one form includes a semiconductor die 102 that is partially enclosed by a thermally conductive container 104 that attaches to a substrate 106. The die 102 is typically attached to a die mounting surface 107 of the substrate 106 with an adhesive layer 108. The substrate 106 may be a multilayer material that includes layers of conducting and insulating materials. Representative materials include insulating circuit board base materials such as polyimide, glass epoxy, and glass fiber layers, as well as conducting layers such as copper, and solder resist layers. The adhesive layer 108 may be a two part epoxy, a thermosetting epoxy, or other adhesive.

The substrate 106 in this example includes a pattern layer 110 (or several pattern layers) and the die 102 is electrically connected to the pattern layer 110 with bond wires 114 that attach to bond pads 112 on the die 102 and the substrate 106. The bond wires 114 generally connect to the pattern layer 110 by extending through an aperture 132 (referred to as a "wire bond slot") in the substrate 106. A bond cap 134 of an epoxy resin, a cured liquid encapsulant, a molded plastic, or other material covers the bond wires 114 and fills the aperture 132, protecting the bond wires 114, the die 102, and edges of the substrate 106. Solder bumps 116 are situated at bond pads 117 provided on a soldering surface 118 of the substrate 106. An encapsulant layer 138 seals to the bond cap 134 and covers or partially covers the bond cap 134. The solder bumps 116 are generally soldered to the bond pads 117 and electrically connected to the pattern layer 110. The solder bumps 116 are used in an additional soldering process or processes to electrically connect the die 102 to a circuit board or other circuit assembly.

The BGA assembly 100 of the form shown in FIGS. 1A-1C includes a moisture barrier 120 that covers perimeter edges of the substrate 106 and the container 104. The illustrated moisture barrier 120 extends to cover an edge region 150 of the substrate 106 and the container 104. In alternative embodiments, the moisture barrier 120 is omitted or extends to cover only selected portions of the edge region 150. Referring to FIG. 1C, the die 102 is thermally connected to die supports 122 formed in the container 104. The die supports 122 contact or closely approach the die 102 to increase thermal conductance from the die 102 to the container 104. The container 104 and the die supports 122 are conveniently formed of a single piece of a thermally conductive material such as copper strip or copper foil, or other heat dissipating or heat absorbing material. Alternatively, the supports 122 can be fabricated separately and then attached to the container 104. The die supports 122 may be configured so that a die attach surface 124 of the die 102 is substantially coplanar with a surface 126 of the container 104 with the die 102 in contact with the supports 122. As used herein, the surfaces 124, 126 are referred to as substantially coplanar if differences in parallelism or offset or other deviations from coplanarity are sufficiently small that a layer of adhesive used to fasten the layers 124, 126 can adequately compensate such deviations. The die 102 is generally attached to the container 104 such as with a thermally conductive epoxy or other adhesive 130A that substantially fills a cavity 130 defined by the die 102 and the container 104. A thermally conductive epoxy, other adhesive, or resin may be used to fill a volume 131 defined by the substrate 106 and the container 104 at a perimeter of the die 102. The encapsulant layer 138 covers the bond cap 132 and portions of a surface 140 of the substrate 106.

The semiconductor die 102 and the bond wires 106 in the embodiment of FIGS. 1A-1C are encapsulated by a bond cap 134 that can be made of a cured liquid encapsulant, a cured epoxy, a molded plastic, a cured liquid resin, or other material. In addition, while the container 104 includes die standoffs 122, containers without die standoffs can be provided.

Figure 2B:
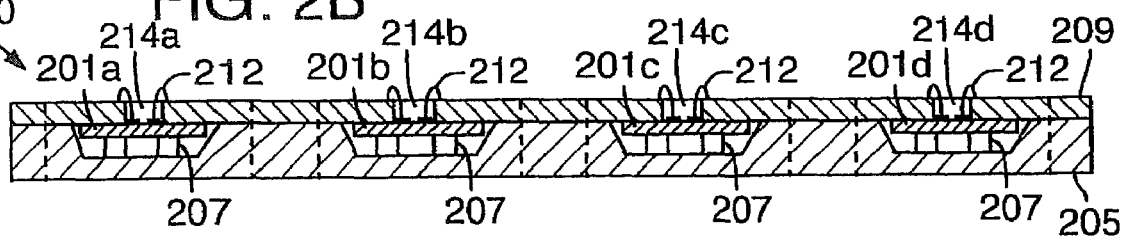

BGA assemblies such as the BGA assembly 100 of FIGS. 1A-1D may also be produced in the form of a BGA assembly strip 200, as illustrated in FIGS. 2A-2B. Semiconductor die 201a-201d are mounted (e.g., adhesively bonded with a thermally conductive adhesive) in respective cavities 203a-203d of containers 204a-204d of a container strip 205. The semiconductor die 201a-201d generally contact die supports 207 provided at each of the cavities 203a-203d. A substrate strip 209 includes substrates 210a-210d that are connected with the bars 211. The substrate strip 209 is attached to the semiconductor die 201a-201d and the container strip 205, such as generally with a layer of an adhesive. The substrate strip 209 is aligned with respect to the container strip 205 so that bond wires 212 pass through apertures 214a-214d and electrically connect the semiconductor die 201a-201d to respective substrates 210a-210d. FIGS. 2A-2B show four semiconductor die 201a-201d attached to the container strip 205, but longer or shorter container strips and substrate strips can be used to mount more or fewer semiconductor die. After the semiconductor die 201a-201d are attached and wire bonded to the container strip 205 and the substrate strip 209, solder bumps (not shown) may be formed on the substrate strip 209 in a conventional manner. The substrate strip 209 and container strip 205 are then cut, sheared, or routed at the tie bars 211 along cut lines 220 so that the semiconductor die 201a-201d are attached to respective substrates 210a-210d and containers 204a-204d and are available as individual BGA assemblies.

Figure 3A:
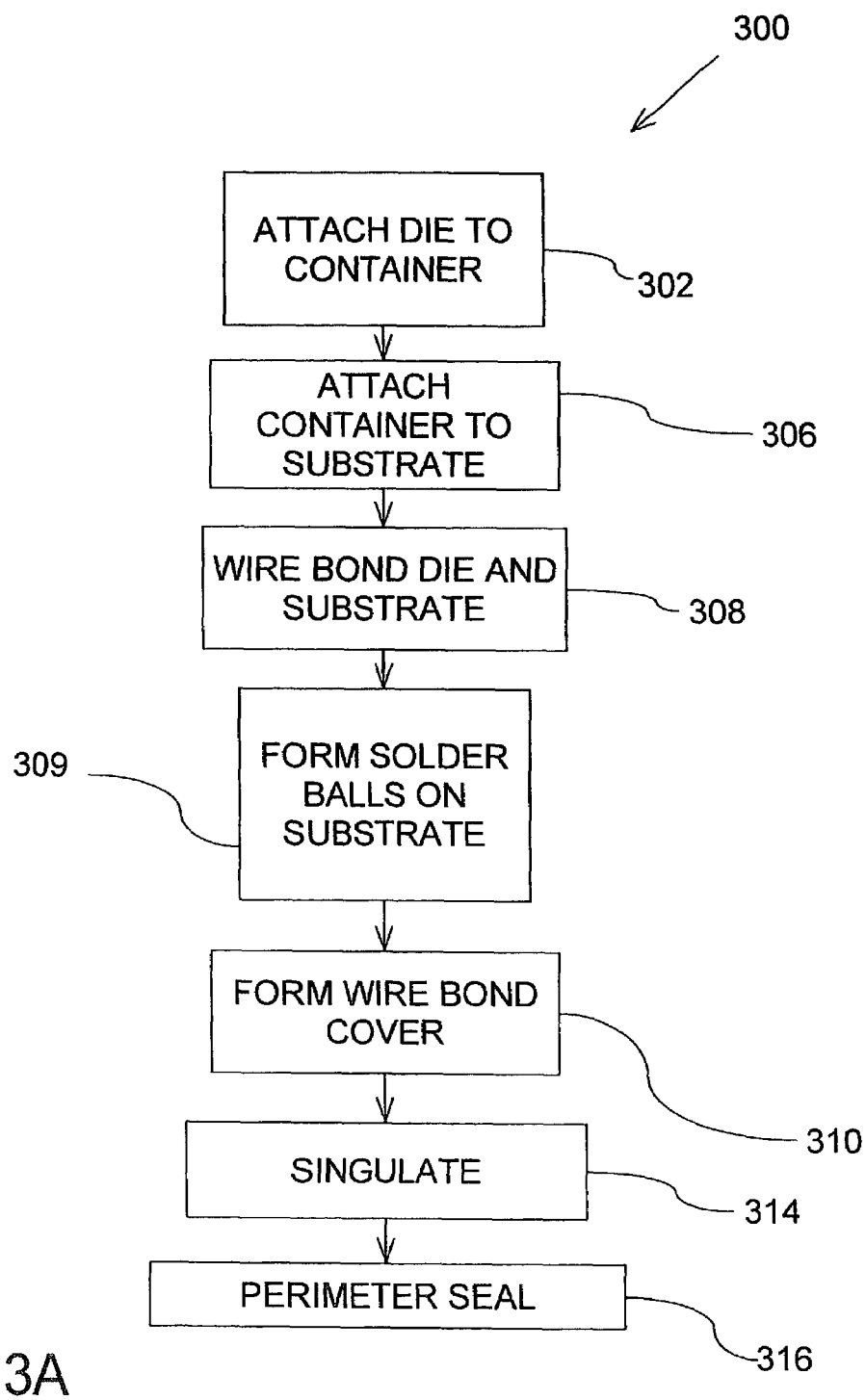
FIGS. 3A-3B are block diagrams of a method of packaging semiconductor die in ball grid array package.

FIG. 3A illustrates one embodiment of a method 300 for packaging a semiconductor chip or die or other circuit element in a ball grid array package such as the package shown in FIGS. 2A-2B. In a step 302, one or more semiconductor die are mounted in corresponding cavities of a container using, for example, a two part epoxy, a thermal epoxy, other thermally conductive adhesive, or solder. Substrates are attached to each of the semiconductor die and associated containers in step 306. The semiconductor die are wire bonded to the substrates in a step 308 and solder bumps are formed on the substrates in a step 309. Bond caps are formed in a step 310. For fabrication of BGA assemblies from a container strip and a substrate strip, individual BGA assemblies are singulated from an assembled strip in a step 314, and a perimeter seal applied in a step 316.

Figure 3B:
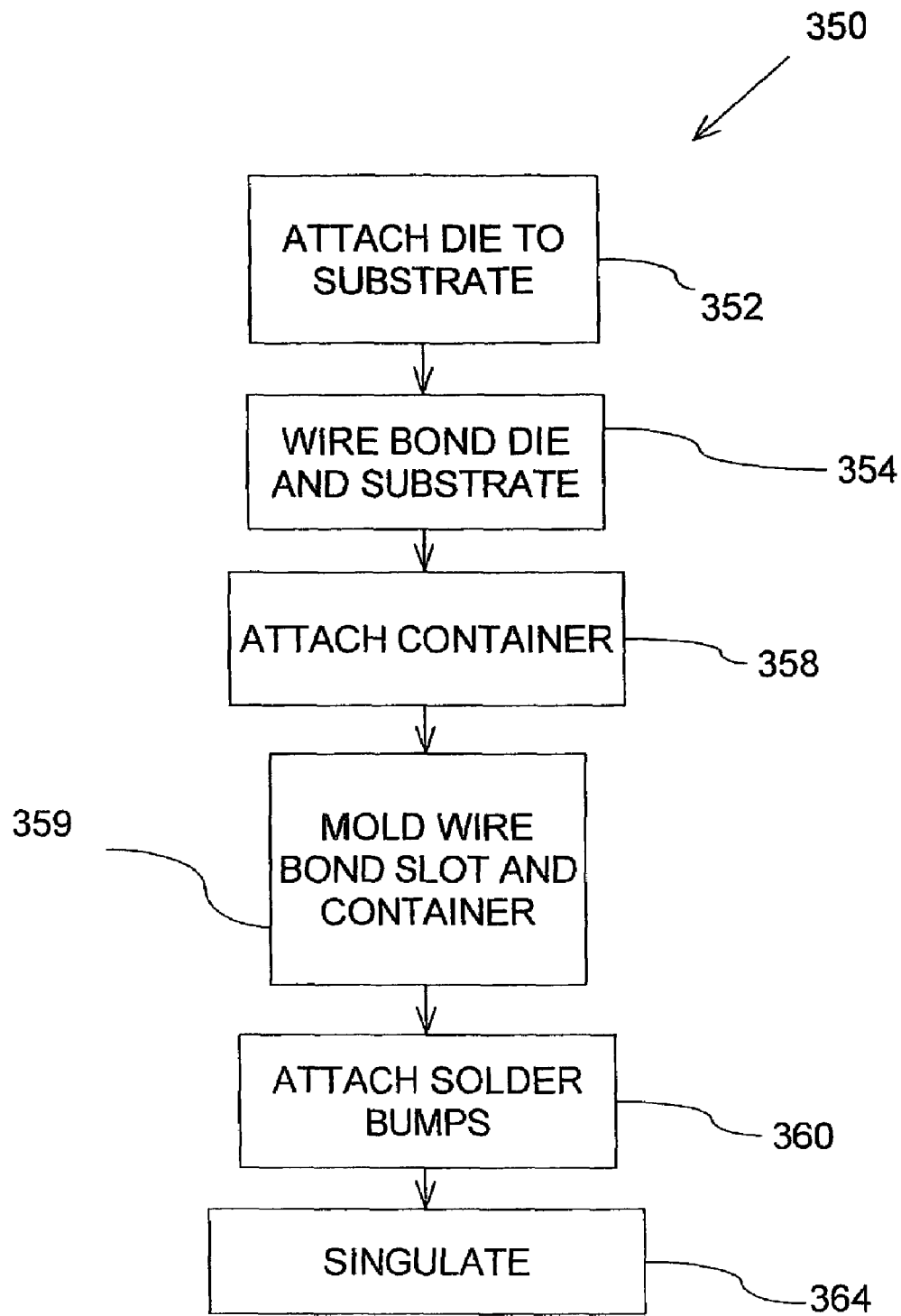

FIG. 3B illustrates an alternative method 350. In a step 352, die are attached to a substrate and in a step 352, the die are wire bonded to a substrate. A container is attached in a step 358, and a wire bond slot is filled with an epoxy or other resin in a step 369. In the step 369, a cavity formed by the container, the die, and the substrate is also partially or completely filled with an epoxy resin or other material. In steps 360, 364, respectively, solder bumps are attached and individual BGA assemblies are signulated.

Figure 4A:
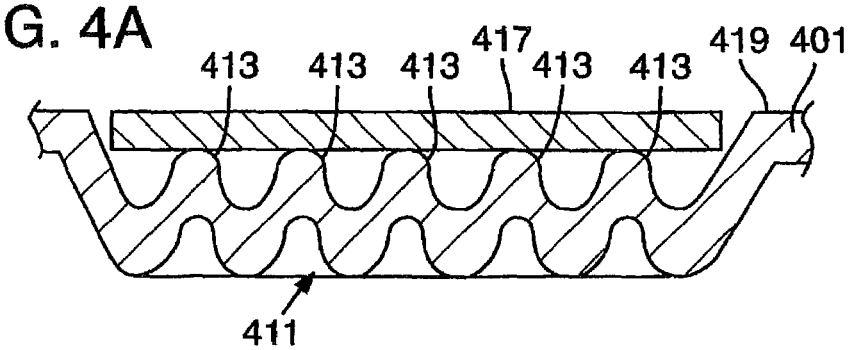
FIGS. 4A-4D are sectional views illustrating alternative containers for ball grid array packages.
Figure 4B:
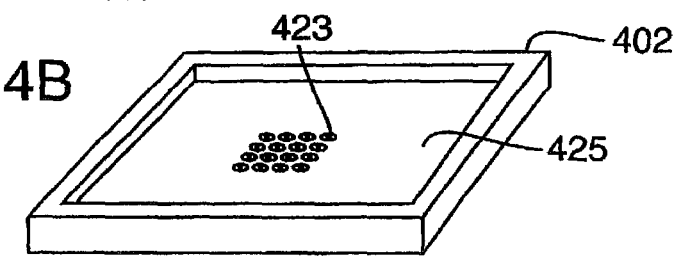

Alternative containers 401-405 are illustrated in FIGS. 4A-4B. The container 401 of FIG. 4A includes a ridged region 411 formed by one or more die supports 413 that support a semiconductor die 414. The ridges in this example comprise undulations in the base of the container. The die supports 413 are situated so that a die surface 417 is approximately parallel and aligned with a plane defined by a container mounting surface 419. The die supports 413 are formed in a wall 425 (FIG. 4B) of the container 402 but in alternative arrangements, die supports can be formed of an additional layer of thermally conductive material, such as a copper foil, and attached to a container by, for example, spot welding or with a thermally conductive adhesive.

Figure 4C:
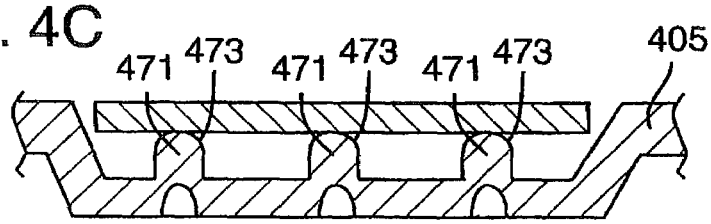

The container 402 of FIG. 4B includes an array of die supports 423. The die supports 423 can be provided uniformly or concentrated at regions of the container 402 at which a die generates substantial heat. FIG. 4C illustrates a container 405 that includes die supports 471 having spherical, elliptical, or otherwise curved die mounting surfaces 473.

Figure 4D:
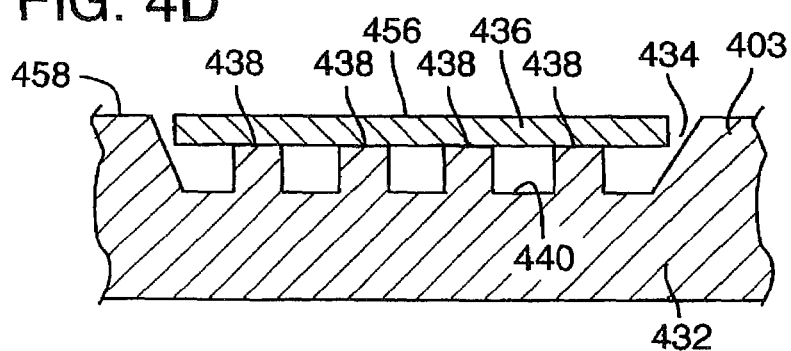
Figure 4E:
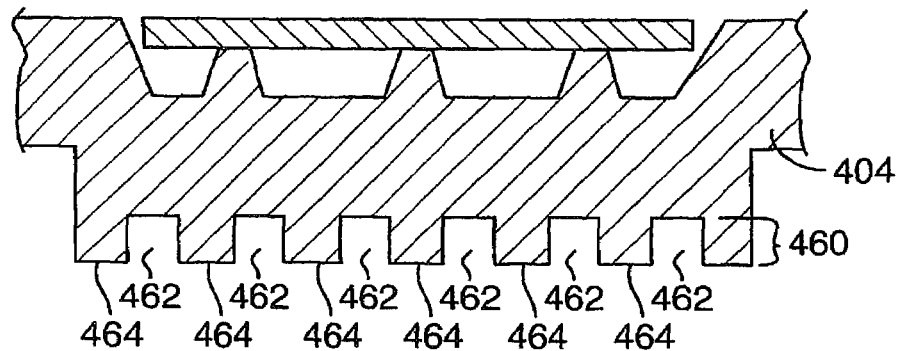
FIG. 4E is a perspective view of a form of BGA assembly that includes an array of die supports.

Containers of a foil or other ductile material can be formed by pressing with or into a mold. Other methods of fabrication include machining and etching. FIG. 4D illustrates a heat dissipating container 403 formed with machining operations in a copper strip or plate 432 (or strip or plate of other thermally conductive, heat absorbing, or heat dissipative material) that includes a cavity 434 configured to retain a semiconductor die 436. Die supports 438 are provided on a surface 440 of the cavity 434. The cavity 434 is configured to at least partially enclose the semiconductor die 436, and the die supports 438 are conveniently configured so that a bonding surface 456 of the die 436 is substantially coplanar with a surface 458 of the container 403. FIG. 4E illustrates a container 404 that includes a heat sink 460, shown in FIG. 4E as a series of grooves 462 and ridges 464. The heat sink 460 can, for example, be formed integrally with the container or can be provided as a separate piece and bonded to a container with a thermally conductive epoxy, welding, or other method.

While the example BGA assemblies described above include solder balls, solder bumps or other solder shapes can be used. As used herein, solder bumps includes solder balls and solder in any other projecting shape, and solder refers to an electrically conducting material that reflows when heated.

While the invention is described with respect to particular implementations, the invention is not limited to these implementations. The invention is directed to novel and non-obvious aspects of this disclosure, both individually and in combination as set forth in the claims below.

We claim:

1. A method of removing heat from a circuit assembly, the circuit assembly including a semiconductor die electrically connected to a substrate having a substantially horizontal surface and a perimeter edge, comprising:
    providing a die container of a thermally conductive material, said die container having a substantially horizontal surface and a perimeter edge;
    attaching the semiconductor die to the container with a thermally conductive layer;
    providing a moisture baffler configured to encapsulate at least a portion of said perimeter edge of said substrate and said perimeter edge of said container; and
    filling a cavity defined by the semiconductor die and the container with a thermally conductive encapsulant.

2. The method of claim 1, further comprising arranging corresponding mounting surfaces of the die and the substrate to be substantially coplanar.

3. A method of packaging a semiconductor die, comprising:
    providing a thermally conductive container that has a first side that defines a die standoff and a second side that defines a heat sink to dissipate heat received by the thermally conductive container, said container having a substantially horizontal surface and a perimeter edge;
    bonding the die to the container so that a surface of the die contacts the die standoff;
    providing a moisture barrier configured to encapsulate at least a portion of a perimeter edge of a substrate and said perimeter edge of said container; and
    filling a cavity defined by the semiconductor die and the container with a thermally conductive encapsulant.

4. A method of packaging a semiconductor die, comprising:
    providing a thermally conductive container that includes a bottom surface, four sidewalls, a perimeter edge and at least one die support coupled to said bottom surface, the die support situated to separate the die from a container surface;
    situating the semiconductor die at least partially within the container and in contact with said at least one die support;
    securing the semiconductor die with respect to the container;
    providing a moisture barrier configured to encapsulate at least a portion of a perimeter edge of a substrate and the perimeter edge of the container; and
    filling a cavity defined by the semiconductor die and the container with a thermally conductive encapsulant.

5. The method of claim 4, wherein the semiconductor die is secured with respect to the container at the die support.

6. The method of claim 4, wherein said perimeter edge of said substrate comprises a substantially vertical edge and said perimeter edge of said container comprises a substantially vertical edge and wherein said moisture barrier is configured to encapsulate at least a portion of said substantially vertical edge of said substrate and said substantially vertical edge of said container.

7. A method of packaging, comprising:
    mounting a plurality of semiconductor die in corresponding cavities formed in a cavity strip, each of said cavities being defined by a bottom surface and four sidewalls;
    attaching a substrate strip to the cavity strip, wherein the substrate strip has a plurality of apertures accommodating bond wires; and
    separating the plurality of die by cutting the cavity strip and the substrate strip at at least one cut line.

8. The method of claim 7, wherein the substrate strip includes substrates corresponding to the cavities and further comprising electrically connecting the die to respective substrates.

9. The method of claim 7, further comprising providing a moisture baffler configured to encapsulate at least a portion of a substrate strip edge and a cavity strip edge.

10. The method of claim 7, further comprising attaching said substrate strip to said cavity strip using an adhesive material.

11. A method of removing heat from a circuit assembly, the circuit assembly including a semiconductor die electrically connected to a substrate having a substantially horizontal surface and an edge, comprising:

provide a die container of a thermally conductive material, said die container having a substantially horizontal surface and an edge;

attaching the semiconductor die to the container with a thermally conductive layer;

providing a moisture baffler configured to encapsulate at least a portion of said edge of said substrate and said edge of said container; and filling a cavity defined by the semiconductor die and the container with a thermally conductive encapsulant.

12. A method of removing heat from a circuit assembly, the circuit assembly including a semiconductor die electrically connected to a substrate having a substantially horizontal surface and a perimeter edge, comprising:

providing a die container of a thermally conductive material, said die container having a substantially horizontal surface and a perimeter edge;

attaching the semiconductor die to the container with a thermally conductive layer; and providing a moisture baffler configured to encapsulate at least a portion of said perimeter edge of said substrate and said perimeter edge of said container, wherein the moisture barrier is configured to encapsulate the entire perimeter edge of the substrate and the perimeter edge of the container.

13. A method of packaging, comprising:

mounting a plurality of semiconductor die in corresponding cavities formed in a cavity strip, each of said cavities being defined by a bottom surface and four sidewalls; and attaching a substrate strip to the cavity strip, wherein the substrate strip has a plurality of apertures accommodating bond wires, wherein the substrate strip includes substrates corresponding to the cavities and further comprising electrically connecting the die to respective substrates.

14. A method of packaging, comprising:

mounting a plurality of semiconductor die in corresponding cavities formed in a cavity strip, each of said cavities being defined by a bottom surface and four sidewalls;

attaching a substrate strip to the cavity strip, wherein the substrate strip has a plurality of apertures accommodating bond wires; and providing a moisture baffler configured to encapsulate at least a portion of a substrate strip edge and a cavity strip edge.

15. A method of packaging, comprising:

mounting a plurality of semiconductor die in corresponding cavities formed in a cavity strip, each of said cavities being defined by a bottom surface and four sidewalls;

attaching a substrate strip to the cavity strip, wherein the substrate strip has a plurality of apertures accommodating bond wires; and attaching said substrate strip to said cavity strip using an adhesive material.

* * * * *

UNITED STATES PATENT AND TRADEMARK OFFICE
CERTIFICATE OF CORRECTION

| | | |
|---|---|---|
| PATENT NO. | : 7,399,657 B2 | Page 1 of 1 |
| APPLICATION NO. | : 10/209753 | |
| DATED | : July 15, 2008 | |
| INVENTOR(S) | : Bolken et al. | |

It is certified that error appears in the above-identified patent and that said Letters Patent is hereby corrected as shown below:

In column 5, line 65, in Claim 1, delete "baffler" and insert -- barrier --, therefor.

In column 6, line 61, in Claim 9, delete "baffler" and insert -- barrier --, therefor.

In column 7, line 10, in Claim 11, delete "baffler" and insert -- barrier --, therefor.

In column 7, line 25, in Claim 12, delete "baffler" and insert -- barrier --, therefor.

In column 8, line 19, in Claim 14, delete "baffler" and insert -- barrier --, therefor.

Signed and Sealed this

Thirtieth Day of September, 2008

JON W. DUDAS
*Director of the United States Patent and Trademark Office*